(12) United States Patent
Zhou et al.

(10) Patent No.: US 9,209,805 B2
(45) Date of Patent: Dec. 8, 2015

(54) OVER-CURRENT AND/OR OVER-VOLTAGE PROTECTION CIRCUIT

(71) Applicant: Applied Wireless Identifications Group, Inc., Morgan Hill, CA (US)

(72) Inventors: Liming Zhou, Lake Hiawatha, NJ (US); Vadim Kikin, Spring Valley, NY (US)

(73) Assignee: Applied Wireless Identifications Group, Inc., Morgan Hill, CA (US)

( * ) Notice: Subject to any disclaimer, the term of this patent is extended or adjusted under 35 U.S.C. 154(b) by 0 days.

(21) Appl. No.: 14/231,227

(22) Filed: Mar. 31, 2014

(65) Prior Publication Data

US 2014/0300387 A1    Oct. 9, 2014

Related U.S. Application Data

(60) Provisional application No. 61/809,239, filed on Apr. 5, 2013.

(51) Int. Cl.
*H03K 19/003* (2006.01)

(52) U.S. Cl.
CPC ................. *H03K 19/00315* (2013.01)

(58) Field of Classification Search
None
See application file for complete search history.

(56) References Cited

U.S. PATENT DOCUMENTS

| | | | |
|---|---|---|---|
| 4,024,501 A | | 5/1977 | Herring et al. |
| 5,382,843 A | * | 1/1995 | Gucyski ..................... 326/109 |
| 5,506,539 A | * | 4/1996 | Kelly et al. ................. 327/379 |
| 6,043,702 A | * | 3/2000 | Singh .......................... 327/534 |
| 6,097,237 A | * | 8/2000 | Singh .......................... 327/389 |
| 6,147,511 A | * | 11/2000 | Patel et al. .................... 326/81 |
| 6,445,214 B2 | * | 9/2002 | Sasaki et al. ................ 326/101 |
| 7,511,531 B2 | * | 3/2009 | Pan et al. ...................... 326/32 |
| 7,550,992 B2 | * | 6/2009 | Briet et al. .................... 326/10 |
| 8,988,105 B2 | * | 3/2015 | Kouno .......................... 326/61 |
| 2002/0118044 A1 | * | 8/2002 | Hirai et al. .................. 326/112 |
| 2006/0049847 A1 | * | 3/2006 | Chen ............................. 326/87 |
| 2008/0150577 A1 | * | 6/2008 | Ueno ............................. 326/33 |
| 2008/0175045 A1 | * | 7/2008 | Lin ............................. 365/182 |
| 2009/0278570 A1 | * | 11/2009 | Kapoor ........................ 326/112 |
| 2014/0035620 A1 | * | 2/2014 | Lin et al. ..................... 326/104 |

OTHER PUBLICATIONS

Sedra et al., "Microelectronic Circuits," Oxford University Press, 2nd Edition, 1997, pp. 1163, 1050, and 1062.

* cited by examiner

*Primary Examiner* — Crystal L Hammond
(74) *Attorney, Agent, or Firm* — Zilka-Kotab, PC

(57) ABSTRACT

A logic inverter with over-current protection according to one embodiment includes a transistor, an input signal line coupled to a gate terminal or base region of the transistor, an output signal line coupled to a drain terminal or collector region of the transistor, a power supply line coupled to the drain terminal or collector region of the transistor, and a feedback resistor between a source terminal or emitter region of the transistor and ground.

16 Claims, 5 Drawing Sheets

OVER-CURRENT AND/OR OVER-VOLTAGE PROTECTION CIRCUIT

RELATED APPLICATIONS

This application claims priority from provisional U.S. Patent Application No. 61/809,239 filed on Apr. 5, 2013, which is herein incorporated by reference.

FIELD OF THE INVENTION

The present invention relates to logic inverters, and more particularly, this invention relates to circuitry to protect logic inverters from exposure to over-voltage and/or over-current, while maintaining functionality.

BACKGROUND

Logic inverters may be used as a driver and/or buffer circuitry between local and/or remote printed circuit boards (PCBs), e.g., between a micro controller and remote equipment. Moreover, logic inverters may provide additional current driving capability to cope with the passive loss, additive noise picked up by PCB traces, and distortion associated with interconnect cables and electrostatic discharge (ESD) protection components.

However, during the installation of devices, faulty operating conditions such as over-voltage and/or short circuits may occur, e.g., due to operator mishandling, stress on the logic converter circuitry, ESD events, inadvertent contact with a power supply, etc. As a result, the power supply voltage may be directly applied to the digital input/output signal terminal by mistake, thereby injecting and/or drawing excessive current. This may cause serious damage to the input/output interface circuitry of equipment, usually rendering the inverter totally useless. Installations with hand-stripped wires are especially prone to such damage.

BRIEF SUMMARY

Various embodiments described herein include transistor based logic output circuitry with over-current protection mechanisms to prevent damage to the transistor.

A logic inverter with over-current protection according to one embodiment includes a transistor, an input signal line coupled to a gate terminal or base region of the transistor, an output signal line coupled to a drain terminal or collector region of the transistor, a power supply line coupled to the drain terminal or collector region of the transistor, and a feedback resistor between a source terminal or emitter region of the transistor and ground.

A logic circuit with overcurrent feedback protection mechanism according to one embodiment in which the logic circuit includes a first transistor, a first input signal line coupled to a gate terminal or a base region of the first transistor, a power supply line coupled to a drain terminal or an emitter region of the first transistor, a second transistor, wherein a source terminal or a collector region of the first transistor is coupled to a drain terminal or an emitter region of the second transistor, a second input signal line coupled to a gate terminal or a base region of the second transistor, an output signal line coupled to a source terminal or a collector region of the second transistor, a third transistor, wherein a source terminal or a collector region of the second transistor is coupled to a drain terminal or a collector region of the third transistor, wherein the second input signal line is coupled to a gate ter al or a base region of the third transistor, a feedback resistor between a source terminal or an emitter region of the third transistor and ground, and a fourth transistor, wherein the source terminal or the collector region of the second transistor is coupled to a drain terminal or a collector region of the fourth transistor, wherein the first input signal line is coupled to the gate terminal or the base region of the third transistor, wherein a source terminal or an emitter region of the fourth transistor is coupled to the feedback resistor.

An isolated inverter with over-current protection according to one embodiment includes a main photo-component, an output signal line coupled to a collector region of the main photo-component, a power supply line coupled to the collector region of the main photo-component, a feedback resistor between an emitter region of the main photo-component and ground, a main light source positioned to emit light for activating the main photo-component, an input signal line coupled to the main light source, a feedback light source coupled in shunt with the feedback resistor, and a feedback photo-component coupled in shunt with the main light source and positioned to be activated by light from the feedback light source.

Other aspects and embodiments of the present invention will become apparent from the following detailed description, which, when taken in conjunction with the drawings, illustrate by way of example the principles of the invention.

DETAILED DESCRIPTION

Figure 1:
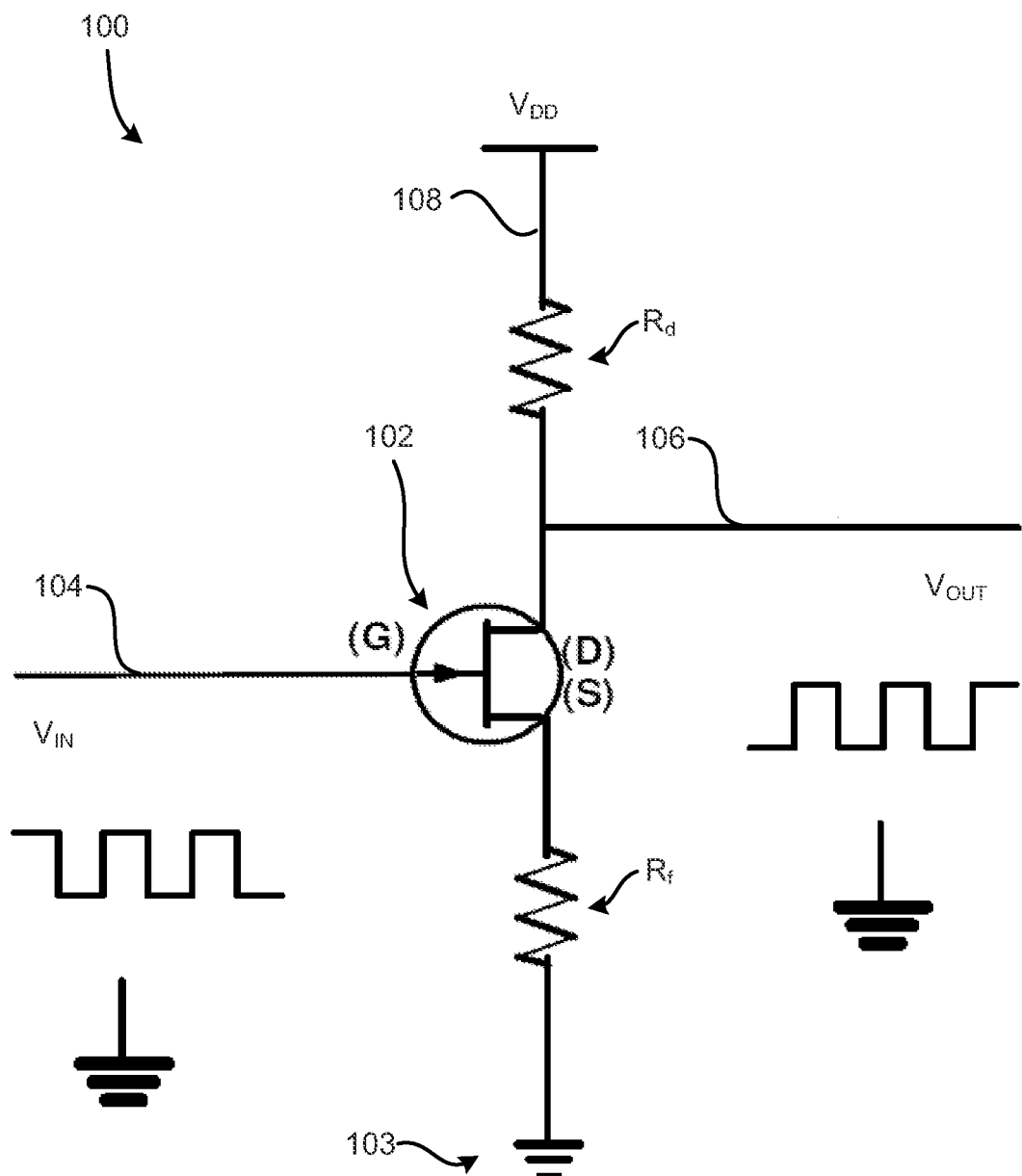
FIG. 1 is a circuit diagram of a logic inverter according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

Moreover, values and parameters of various components recited herein, such as resistors, may be readily determined by one skilled in the art after having read the present disclosure.

It must also be noted that, as used in the specification and the appended claims, the singular forms "a," "an" and "the" include plural referents unless otherwise specified. Furthermore, as used herein, the term "about" with reference to some stated value refers to the stated value ±10% of said value.

Various embodiments described and/or suggested herein preferably include a set of switch-based logic output circuitry with over-current protection mechanisms, e.g., to prevent damage to the switch, e.g., transistor, therein such as by overheating of the switch.

In one general embodiment, a logic inverter with over-current protection includes a transistor, an input signal line coupled to a gate terminal or base region of the transistor, an output signal line coupled to a drain terminal or collector region of the transistor, a power supply line coupled to the drain terminal or collector region of the transistor, and a feedback resistor between a source terminal or emitter region of the transistor and ground.

In another general embodiment, a logic circuit with over-current feedback protection mechanism includes a first transistor, a first input signal line coupled to a gate terminal or a base region of the first transistor, a power supply line coupled to a drain terminal or an emitter region of the first transistor, a second transistor, wherein a source terminal or a collector region of the first transistor is coupled to a drain terminal or an emitter region of the second transistor, a second input signal line coupled to a gate terminal or a base region of the second transistor, an output signal line coupled to a source terminal or a collector region of the second transistor, a third transistor, wherein a source terminal or a collector region of the second transistor is coupled to a drain terminal or a collector region of the third transistor, wherein the second input signal is coupled to a gate terminal or a base region of the third transistor, a feedback resistor between a source terminal or an emitter region of the third transistor and ground, and a fourth transistor, wherein the source terminal or the collector region of the second transistor is coupled to a drain terminal or a collector region of the fourth transistor, wherein the first input signal line is coupled to the gate terminal or the base region of the third transistor, wherein a source terminal or an emitter region of the fourth transistor is coupled to the feedback resistor.

In yet another general embodiment, an isolated inverter with over-current protection includes a main photo-component, an output signal line coupled to a collector region of the main photo-component, a power supply line coupled to the collector region of the main photo-component, a feedback resistor between an emitter region of the main photo-component and ground, a main light source positioned to emit light for activating the main photo-component, an input signal line coupled to the main tight source, a feedback light source coupled in shunt with the feedback resistor, and a feedback photo-component coupled in shunt with the main tight source and positioned to be activated by light from the feedback light source.

As mentioned above, logic inverters may be used as a driver and/or buffer circuitry between two or more local and/or remote PCBs. For example, logic inverters may be used when connecting a control panel with one or more remote access readers. In other examples, two distinct areas of a computer hard drive may be connected using logic inverters, at least in part. Moreover, various embodiments described herein include transistor based logic output circuitry with over-current protection mechanisms to prevent damage to the components of the logic inverter, e.g., the transistor(s) thereof.

According to one approach, an inverter, such as the inverter illustrated in circuit 100 of FIG. 1, may be a driver (also referred to herein as a coordinator) between at least two different PCBs. For example, in one illustrative implementation, at least one reader is connected to a control panel via the circuit 100, e.g., as may be seen with a radio-frequency identification (RFID) reader and a control panel system. Accordingly, the control panel may be on one PCB board, while each of the readers has their own respective PCB boards. It follows that if a microcontroller is used on one of the aforementioned PCBs, a corresponding signal may be driven to the at least one other PCB, via an interconnection, e.g., a wire, cable, lead, etc. and the circuit 100.

However, the interconnection between the at least two PCBs has a capacitance, inductance and resistance associated therewith, resulting in a voltage drop thereacross. Thus, if an interconnection spans a sufficiently long distance, it may be desired that driver circuits be distributed across both the local and remote PCBs, e.g., to compensate for the aforementioned voltage drops along the interconnection. Moreover, when connecting multiple readers to a controller, driver symmetry is desirable.

FIG. 1 is a diagram for a logic inverter circuit 100, in accordance with one embodiment. As an option, the present circuit 100 may be implemented in conjunction with features from any other embodiment listed herein, such as those described with reference to the other FIGS. Of course, however, such circuit 100 and others presented herein may be used in various applications and/or in permutations which may or may not be specifically described in the illustrative embodiments listed herein. Further, the circuit 100 presented herein may be used in any desired environment.

As mentioned above, FIG. 1 includes a circuit diagram illustrating an enhanced mode based N-channel logic inverter circuit 100 with over-current protection, according to an illustrative embodiment. Moreover, the logic inverter circuit 100 includes a transistor 102. In the present embodiment, the transistor 102 is an n-channel field-effect transistor (FET). However, although transistor 102 is illustrated in the present embodiment as being a n-channel field-effect transistor (FET), in various other approaches, transistor 102 may include an a metal-oxide-semiconductor field-effect transistor (MOSFET), single pole-double throw (SPDT) switch, etc., or any other type of transistors which would be apparent to one skilled in the art upon reading the present description.

Accordingly, the transistor 102 includes a gate terminal (G), a drain terminal (D) and a source terminal (S). An input signal line 104 is coupled to the gate terminal (G) of the transistor 102 and an output signal line 106 is coupled to the drain terminal (D) of the transistor. Furthermore, a power supply line 108 is coupled to the drain terminal (D) of the transistor 102.

Although not explicitly shown in FIG. 1, the input of the inverter circuit 100 is preferably connected to a micro-controller unit (MCU), and the output of the inverter circuit 100 is preferably connected to remote off-board circuitry. The desired effect of the inverter is to invert the incoming signal $V_{IN}$ being introduced to the transistors 102 along the input signal line 104, into an inverted signal $V_{OUT}$ being output from the transistors 102 along, the output signal line 106. Moreover, it is preferred that $V_{OUT}$ has a load whose impedance does not exceed the range limited by the local driver circuit.

The inverter circuit 100 also includes a pull up resistor $R_d$, which is positioned in series between the drain terminal (D) of transistor 102 and power supply $V_{DD}$. Moreover, the pull up resistor $R_d$ is also positioned between the power supply $V_{DD}$ and the output signal line 106. The pull up resistor $R_d$ preferably protects the circuitry (e.g., components) of the inverter circuit 100 from exposure to high current as would be appreciated by one skilled in the art upon reading the present description. According to one approach, the pull up resistor $R_d$ may be placed on a remote PCB without affecting the function of circuit 100 as an inverter.

A feedback resistor is also positioned between the source terminal (S) of the transistor 102 and ground 103 (e.g., electrical ground). Although going against conventional wisdom, by placing a resistor ($R_f$) between the source terminal (S) of the transistor 102 and ground 103, this configuration protects the inverter circuitry from over-voltage and/or short circuits, as will be discussed in detail below.

According to exemplary embodiments, the load impedance of the logic inverter circuit 100 may be assumed to be $R_l$. Thereby the lower limit of $R_l$ and upper limit of transistor current may be used to determine the proper resistance value of $R_f$ according to various approaches.

Following an illustrative in-use embodiment of the inverter circuit 100, in operation, when a sufficiently high level signal comes from a MCU, e.g., via input signal line 104, into the gate terminal (CO of the transistor 102, the gate threshold voltage is reached and the channel of the transistor 102 turns on, e.g., closes. As a result, a low impedance path is formed through the transistor 102 to ground 103, and the voltage $V_{OUT}$ on output signal line 106 will fall from a higher voltage to a tower voltage, thereby indicating a logic inversion. The current from $V_{DD}$ passes to ground 103, and the voltage $V_{OUT}$ on the output signal line 106 is drawn down. Moreover, it is preferred that the impedance value of feedback resistor $R_f$ is significantly lower than the impedance value of pull up resistor $R_d$. As a result, the functionality of the inverter circuit 100 may be preserved.

In the event of a fault current occurring on the output signal line 106 of the inverter circuit 100, e.g., potentially resulting from an event down the output signal line 106, the increased current on the resistor feedback resistor $R_f$ desirably increases the potential of the drain terminal (D) of the transistor 102 and forces the conducting channel to clamp off due to the reduced transistor gate-to-source voltage, thereby protecting the transistor from over-current and/or over-heating.

Contrary to conventional wisdom, the feedback resistor $R_f$ may be included in digital circuitry, e.g., between two PCB boards, without significant detrimental effect on the inverter's functionality, as seen in various embodiments herein. According to conventional wisdom, in digital circuitry, any resistance added between the drain of a given transistor and ground may significantly hinder switching of the inverter, in addition to decreasing the quality of the switching by reducing the flow of current to ground when the switch is dosed. One skilled in the art will appreciate that pursuant to conventional knowledge, no resistance is added between the drain of a transistor and ground in such digital systems in order to avoid such problems. However, looking to various approaches described and/or suggested herein, the inventors proceeded contrary to conventional wisdom by adding the resistor $R_f$ to the digital inverter.

According to an example, which is in no way intended to limit the invention, as described immediately above, a transistor is turned on when the value of the resistor $R_f$ is equal to zero, and the input signal is high, $V_{IH}$ (logic high). As a result, the transistor channel between the source and load may be turned on, and the channel current $I_d$ through the transistor is limited by a source resistor $R_s$. Therefore, according to one approach, the value $R_f$ is preferably calculated based on the maximum channel current $I_{d,max}$, the transistor turn-on voltage $V_{th}$, and $V_{IH}$ as follows.

$$V_{IH} - V_{th} < R_f I_{d,max}$$

As alluded to above, the resistance value of feedback resistor $R_f$ is ideally much smaller than the resistance value of the pull up resistor $R_d$ in a functional inverter. For example, according to various approaches, the value of $R_d$ may be from about 0.3 kΩ to about 30 kΩ, but may be higher or lower depending on the desired embodiment. The value of feedback resistor $R_f$ may be from about 0.003 kΩ to about 3 kΩ, but may be higher or lower depending on the desired embodiment. Thus, according to a further approach, the power rating of the feedback resistor is desirably higher than the value $P_{max}$, which may be determined by $V_{IH}$, $V_{th}$, and the resistance $R_f$ as follows:

$$P_{max} = \frac{(V_{IH} - V_{th})^2}{R_f}$$

The typical load impedance (to ground) of the logic circuit is desirably much higher than the value of the feedback resistor $R_f$, and higher than pull up resistor $R_d$, e.g., so that during the logic high output state, the majority of the power supply voltage is applied to the load.

Depending on the embodiment, the power supply voltage $V_{DD}$ may be different from the input stage power supply in a level-shifted inverter. Moreover, according to different approaches, the pull up resistor $R_d$ and/or the output power supply may be optionally removed from the inverter in an open-drain configuration. In some approaches, a load side circuit board may provide the pull up resistor and/or the DC voltage supply.

Figure 2:
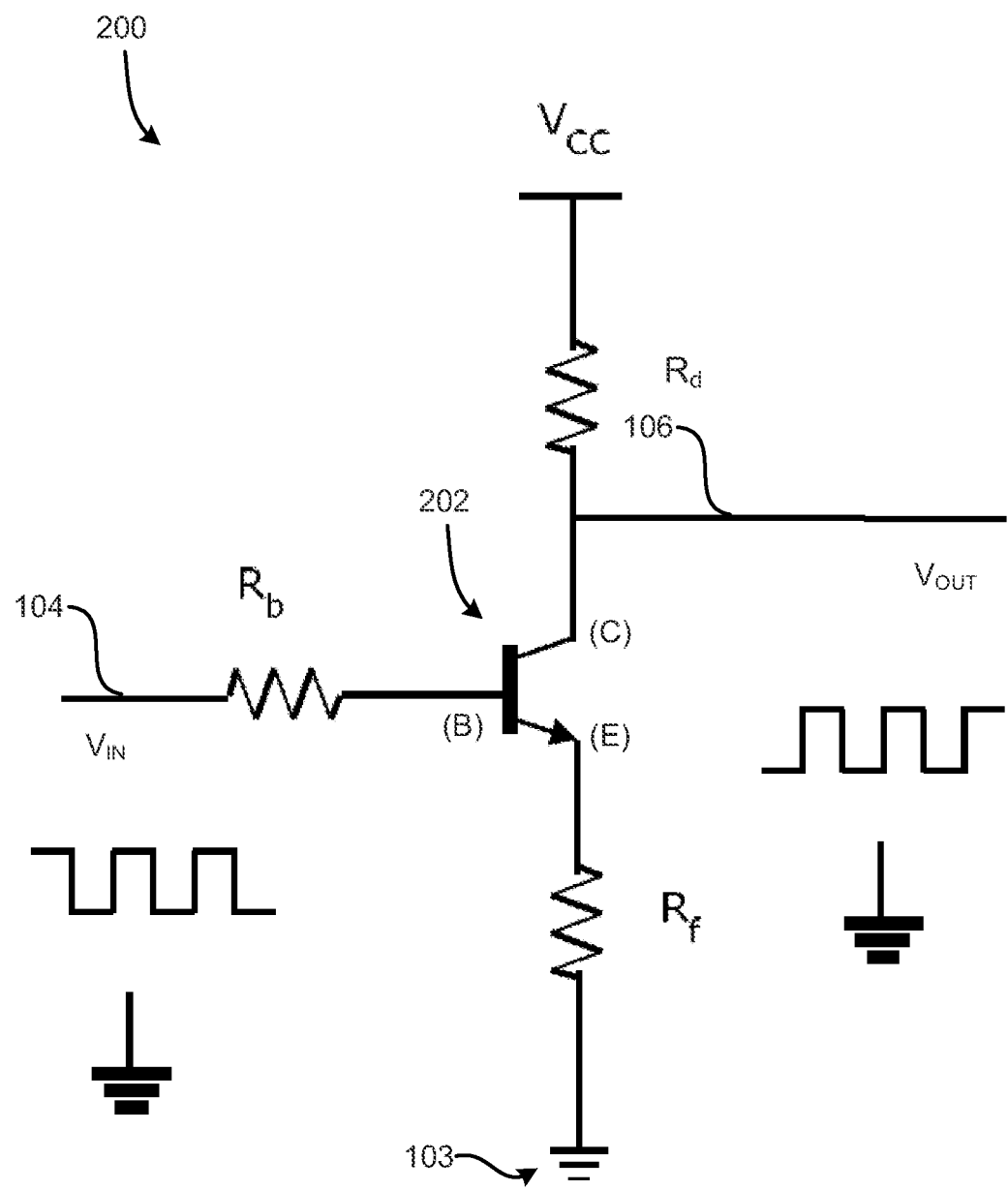
FIG. 2 is a circuit diagram of a logic inverter according to one embodiment.

Looking now to FIG. 2, a diagram for a logic inverter circuit 200 is illustrated in accordance with one embodiment. As an option, the present circuit 200 may be implemented in conjunction with features from any other embodiment listed herein, such as those described with reference to the other FIGS., such as FIG. 1. Accordingly different of FIG. 2 have common numbering with those of FIG. 1.

Of course, however, such circuit 200 and others presented herein may be used in various applications and/or in permutations which may or may not be specifically described in the illustrative embodiments listed herein. For example, one may choose to implement a BJT inverter using a PNP transistor in common collector configuration. In such case, the feedback resistor $R_f$ is desirably positioned between the emitter and power supply. Further, the circuit 200 presented herein may be used in any desired environment.

Referring now to FIG. 2, the circuit diagram is of an NPN bipolar junction transistor (BJT) logic inverter circuit 200 with over-current protection capability. As illustrated, the inverter circuit 200 includes a transistor 202 having a collector region (C), abuse region (B) and an emitter region (E).

In a preferred approach, the values of the emitter degeneration resistor are determined by the maximum emitter current $I_e$ and the base-emitter saturation voltage $V_{BEsat}$ of the NPN BJT, as well as the input logic high voltage $V_{IH}$ to the inverter. Feedback resistor $R_f$ limits the current through transistor 202, and also defines the input impedance of inverter. For example, if input impedance is too low for source of the signal $V_{IN}$, resistor $R_b$ may be added to normalize this impedance. The value of $R_b$ may be defined by the maximum current capability of source of $V_{IN}$ and the base-emitter saturation voltage $V_{BEsat}$ in the presence of feedback resistor $R_f$.

It also should be noted that although the BIT 202 is labeled as having a collector region (C), a base region (B) and an emitter region (E), the names of the regions are in no way intended to limit the invention. For example, the inverter circuit 200 of FIG. 2 may implement a FET, e.g., as shown in FIG. 1, having a drain terminal (D) a gate terminal (G) and a source terminal (S), rather than the aforementioned collector region (C), a base region (B) and an emitter region (E) of BIT 202. In further examples, gate terminal (G) of BJT 202 may represent a base region while drain terminal (D) and a source terminal (S) may represent collector and emitter regions respectively. It follows that the foregoing naming conventions for the terminals and regions of the various embodiments described herein are in no way intended to limit the invention. Rather, naming conventions for the terminals or regions are provided by way of example only and are intended to include any equivalent portion of any type of transistor, where said portion may depend on the type of transistor used in a particular embodiment as would be appreciated by one skilled in the art upon reading the present description.

Again, the configuration of the various components illustrated in FIG. 2 is in no way intended to limit the invention, but rather is presented by way of example. Furthermore, source $V_{CC}$ may include any of the approaches described and/or suggested above with reference to power supply $V_{DD}$ of FIG. 1.

Figure 3:
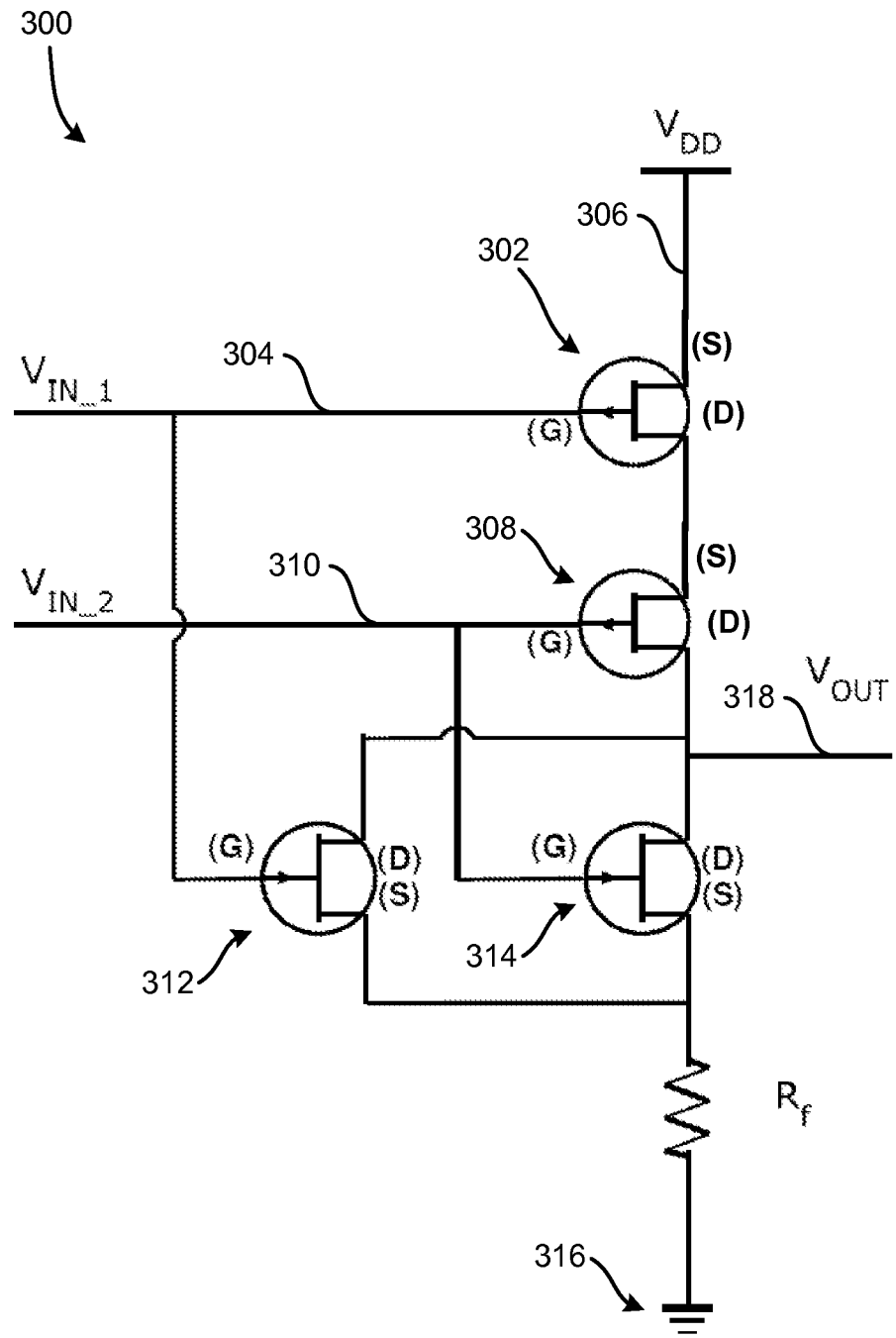
FIG. 3 is a circuit diagram of a logic circuit according to one embodiment.

FIG. 3 is a circuit diagram for a logic circuit 300, in accordance with another embodiment. As an option, the present circuit 300 may be implemented in conjunction with features from any other embodiment listed herein, such as those described with reference to the other FIGS. Of course, however, such circuit 300 and others presented herein may be used in various applications and/or in permutations which may or may not be specifically described in the illustrative embodiments listed herein. Further, the circuit 300 presented herein may be used in any desired environment.

With reference to FIG. 3, the circuit diagram is of a NOR complementary metal oxide semiconductor (CMOS) logic circuit 300 with overcurrent feedback protection mechanism. The logic circuit 300 includes a first transistor 302 having a gate terminal (G), drain terminal (D) and source terminal (S). Moreover, a first input signal line 304 is coupled to the gate terminal (G) of the first transistor 302, while a power supply line 306 is coupled to the source terminal (S) of the first transistor 302. Additional circuitry is also present.

Logic circuit 300 further includes a second transistor 308 having a gate terminal (G), drain terminal (D) and source terminal (S). Moreover, the drain terminal (D) of the first transistor 302 is coupled to a source terminal (S) of the second transistor 308. A second input signal line 310 is also coupled to the gate terminal (G) of the second transistor 308. Furthermore, an output signal line 318 is coupled to the drain terminal (D) of the second transistor 308.

Third and fourth transistors 312, 314 are also included, both of which having a gate terminal (G), drain terminal (D) and source terminal (S). Third transistors 312 is preferably positioned such that the drain terminal (D) of the second transistor 308 is coupled to the drain terminal (D) of the third transistor 312. Moreover, the second input signal line 310 is coupled to the gate terminal (G) of the third transistor 312. A feedback resistor $R_f$ is also positioned between the source terminal (S) of the third transistor 312 and ground 316.

The fourth transistor 314 is positioned such that the drain terminal (D) of the second transistor 308 is coupled to the drain terminal (D) thereof. Furthermore, the first input signal line 304 is coupled to the gate terminal (G) of the third transistor 312, and the source terminal (S) of the fourth transistor 314 is coupled to the feedback resistor $R_f$.

Referring still to FIG. 3, in some embodiments, an excessive current coming from the output terminal $V_{OUT}$ at the logic low output stage may increase the voltage drop across the feedback resistor $R_f$. This result may then preferably turn off the channels of the third and fourth transistors 312, 314 which may include two enhance-mode n-channel metal oxide semiconductor (NMOS) FETs. Furthermore, first and second transistors 302, 308, which preferably include two p-channel metal-oxide-semiconductor (PMOS) FETs, are connected in series to form the pull up current path according to an exemplary embodiment.

According to an exemplary embodiment, which is in no way intended to limit the invention, a method of using a feedback resistor may be used to turn off the pull-down current path. Moreover, in another approach, the method may also be applied to combinational logic circuits such as NAND and NOR logic circuits.

Furthermore, the protection mechanism embodiment illustrated in FIG. 3 may also be applied to BJT based combination circuits, but is not limited thereto. For example, referring again to FIG. 3, a BJT NOR logic circuit may be created by replacing the NMOS FET with an NPN transistor and/or replacing the PMOS FET with a PNP transistor.

As mentioned above, it also should be noted that although transistors 302, 308, 312, 314 are labeled as having a gate terminal (G), a drain terminal (D) and a source terminal (S), the names of the terminals are in no way intended to limit the invention. Again, in various embodiments, one or more of the transistors 302, 308, 312, 314 may implement NPN transistor(s) and/or PNP transistor(s), having, a collector region (C), a base region (B) and an emitter region (E), rather than the aforementioned drain terminal (D) a gate terminal (G) and a source terminal (S). In further examples, first and second transistors 302, 308 may include PNP transistors. Thus, the gate terminal (G) of first and second transistors 302, 308 may represent a base region while drain terminal (D) and a source terminal (S) thereof may represent collector and emitter regions respectively. Furthermore, third and fourth transistors 312, 314 may include NPN transistors. Thus, the gate terminal (G) of first and second transistors 312, 314 may represent a base region while drain terminal (D) and a source terminal (S) thereof may represent collector and emitter regions respectively. It follows that the foregoing naming conventions for the terminals and regions of the various embodiments described herein are in no way intended to limit the invention, and should be deemed to include any equivalent region of any type of transistor, as would be appreciated by one skilled in the art upon reading the present description.

According to another exemplary embodiment, which is in no way intended to limit the invention, an isolated logic inverter may be constructed, e.g., by replacing the NPN transistor shown in FIG. 2, with an opto-isolator. In a preferred approach, an opto-isolator may include an LED and a phototransistor.

Figure 4:
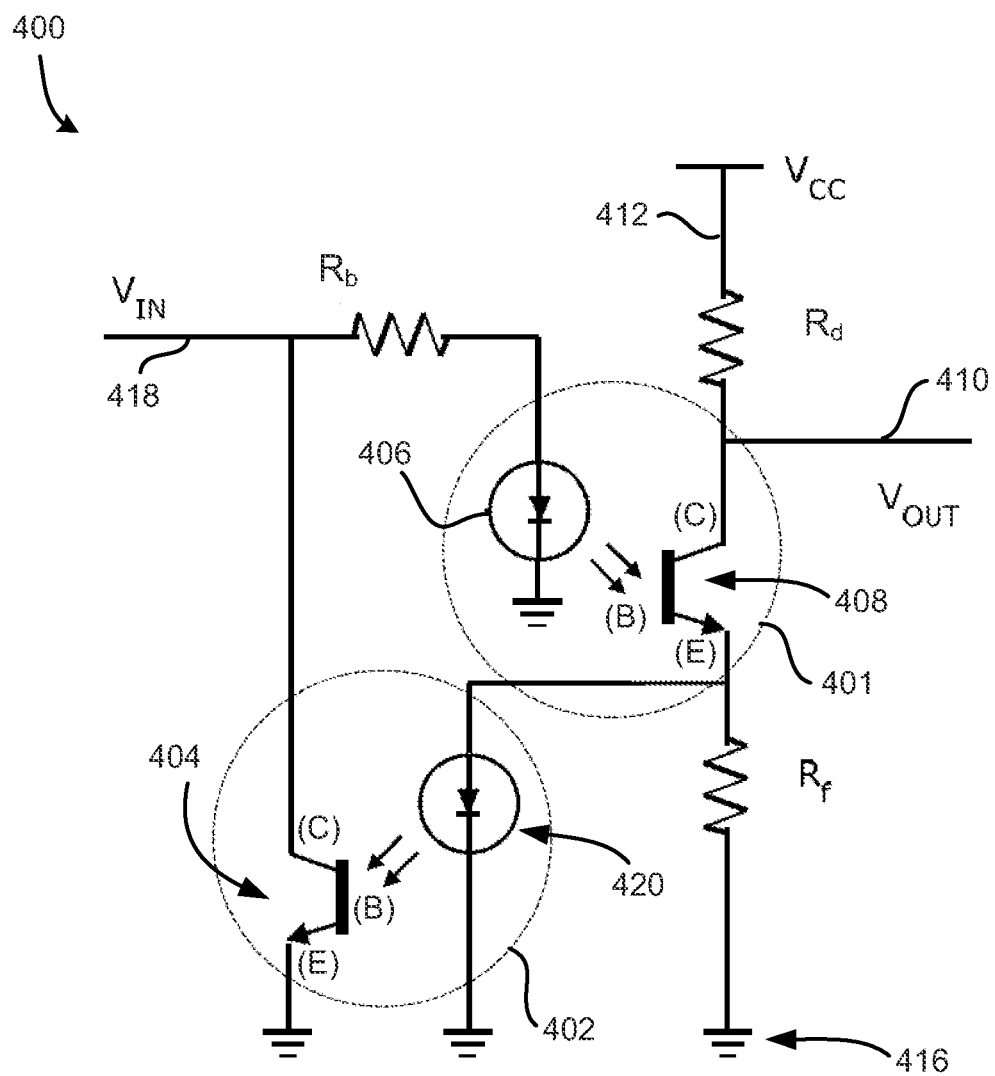
FIG. 4 is a circuit diagram of an isolated inverter according to one embodiment.

FIG. 4 is a circuit diagram for an isolated inverter circuit 400 with over-current protection, in accordance with one embodiment. As an option, the present circuit 400 may be implemented in conjunction with features from any other embodiment listed herein, such as those described with reference to the other FIGS. Of course, however, such circuit 401) and others presented herein may be used in various applications and/or in permutations which may or may not be specifically described in the illustrative embodiments listed herein. Further, the circuit 400 presented herein may be used in any desired environment.

As alluded to above, the isolated inverter circuit 400 of FIG. 4 has over-current protection. According to the present embodiment, the isolated inverter circuit 400 is illustrated as having a main opto-isolator 401 which includes a main photo-component 408 and a main light source 406. Although the main light source 406 may include any type of light source, e.g., light-emitting diode (LED), laser, halogen, etc., it is preferred that the main light source 406 is an LED. Moreover, it should be noted that photo-components as used herein may also be referred to as photo-transistors.

In the present embodiment, inverter circuit 400 includes a main photo-component 408 and a feedback photo-component 404, both of which having a collector region (C), a base region (B) and an emitter region (E). However, as previously mentioned, although main photo-component 408 and a feedback photo-component 404 are labeled as having a collector region (C), a base region (B) and an emitter region (E), the names of the regions are in no way intended to limit the invention. For example, the main photo-component 408 and/or the feedback photo-component 404 may implement a PET, e.g., as shown in FIG. 1, having, a drain terminal (D) a gate terminal (G) and a source terminal (S), rather than the aforementioned collector region (C), a base region (B) and an emitter region (E) of main photo-component 408 and feedback photo-component 404. In further examples, gate terminal (G) of main photo-component 408 and/or the feedback photo-component 404 may represent a base region while drain terminal (D) and a source terminal (S) may represent collector and emitter regions respectively. It follows that the foregoing naming conventions for the terminals and regions of the various embodiments described herein are in no way intended to limit the invention, and should be deemed to include any equivalent region of any type of transistor, as would be appreciated by one skilled in the art upon reading the present description.

With continued reference to the isolated inverter circuit 400 of FIG. 4, the main photo-component 408 is positioned in the present embodiment such that an output signal line 410 is coupled to a collector region (C) of the main photo-component 408. Additionally, a power supply line 412 is preferably coupled to the collector region (C) of the main photo-component 408. Feedback resistor $R_f$ is also positioned between the emitter region (E) of the main photo-component 408 and ground 416.

The main light source 406 is preferably positioned to emit light towards the main photo-component 408, e.g., for activating the main photo-component 408. Moreover, input signal line 418 is coupled the main light source 406, e.g., for providing an operating signal and/or operational power thereto. It follows that any photo-component described herein may include any conventional photo activated transistor as would be appreciated by one skilled in the art upon reading the present description.

Referring still to FIG. 4, a second light source 420 of feedback opto-isolator 402 is coupled in shunt with the feedback resistor $R_f$ and is preferably positioned to emit light towards the feedback photo-component 404. Thus, the second light source 420 and feedback photo-component 404 are preferably positioned such that the feedback photo-component 404 may be activated by light from the second light source 420. As mentioned above, second light source 420 may include any type of conventional light emitting source in various approaches, but is preferably an LED.

As mentioned above, the second light source 420 is inserted in shunt with the feedback resistor $R_f$, and the feedback photo-component 404 is coupled in shunt with the main light source 406, here an LED, and corresponding bias resistor $R_b$. Thus, an inverse proportional relationship is established between the main photo-transistor 408 current and main light source 406 current. As a result, an increase of output current coming from the external load during the logic low output state may trigger the second light source 420 and photo-transistor 404, and thus cut down the supply current to the main light source 406 and increase resistance of the main photo-transistor 408. Thus, the forward voltage $V_F$ of the second light source 420 may become the threshold voltage for the feedback resistor $R_f$.

According to yet another approach, photo-resistors and/or photo-diodes may be used to replace one or both of the photo-components 408, 404 in FIG. 4 without affecting the function of the isolated inverter 400.

Figure 5:
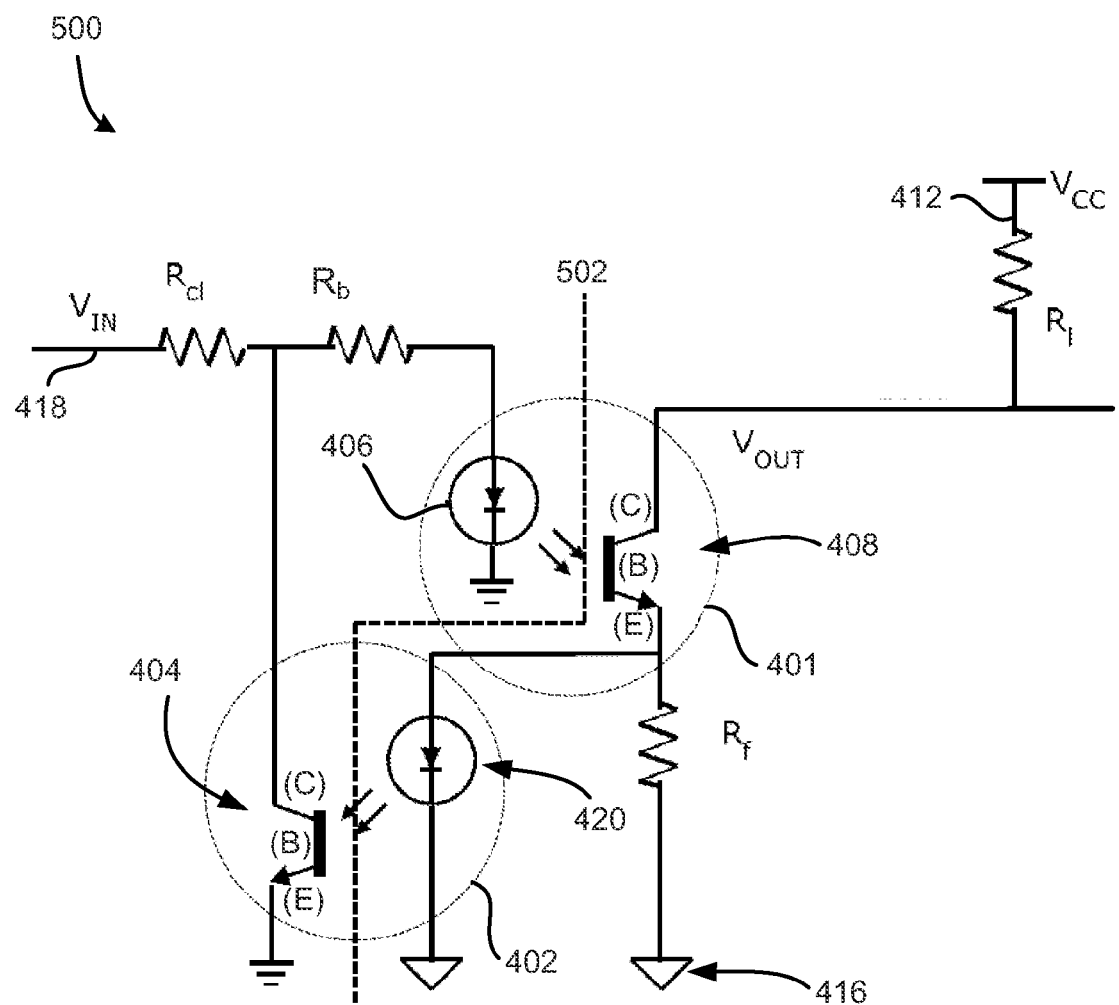
FIG. 5 is a schematic diagram of a fully isolated inverter according to one embodiment.

FIG. 5 is a schematic diagram for a full isolated inverter 500, in accordance with one embodiment. As an option, the present circuit 500 may be implemented in conjunction with features from any other embodiment listed herein, such as those described with reference to the other FIGS., such as FIG. 4. Accordingly, various components of FIG. 5 have common numbering with those of FIG. 4. It should also be noted that the naming conventions for the regions of the present embodiment are in no way intended to limit the invention. Rather, as described above with reference to FIG. 4, naming conventions for terminals or regions as used herein may depend on the type of transistor used in a particular embodiment as would be appreciated by one skilled in the art upon reading the present description.

Of course, however, such circuit 500 and others presented herein may be used in various applications and/or in permutations which may or may not be specifically described in the illustrative embodiments listed herein. Further, the circuit 500 presented herein may be used in any desired environment. Thus FIG. 5 (and the other FIGS.) should be deemed to include any and all possible permutations.

With reference to FIG. 5, the circuit diagram is a schematic diagram of a fu isolated inverter 500 having electrical isolation generally along line 502 between two portions of the circuitry thereof. In various approaches, the electrical isolation between the two portions of the inverter circuitry may be achieved by using any methods and/or materials which would be apparent to one skilled in the art upon reading the present description. For example, a transparent or translucent electrically insulating layer, gas, void, etc. may be positioned along dotted line 502 of FIG. 5. Thus, according to one approach, the power supply $V_{CC}$ and ground 416 of the main opto-isolator 401 may be completely electrically separated from the feedback opto-isolator 402. However, it is preferred that the method and/or materials used to create the electrical isolation between two portions of the inverter circuitry allows for the tight emitted from one or both of the tight sources 406, 420 to reach the corresponding photo-components 404, 408, e.g., for activation thereof.

Inverter 500 also includes a remote pull-up resistor $R_1$ forming a remote load. Moreover, putt-up resistor $R_1$ is coupled between the power supply line 412 and the drain terminal of the main photo-component 408. Moreover, as illustrated in FIG. 5, an optional current limiting resistor $R_{cl}$, having a value in a range between about 0.1 kΩ and about 10 kΩ, may be inserted in series with the feedback photo-transistor 404 of the feedback photo-component, e.g., to protect the feedback components from overloading.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A logic inverter with over-current protection, comprising:
   a transistor;
   an input signal line coupled to a gate terminal or base region of the transistor;
   an output signal line coupled to a drain terminal or emitter region of the transistor;

a power supply line coupled to the drain terminal or emitter region of the transistor; and a feedback resistor between a source terminal or collector region of the transistor and ground, wherein an impedance value $R_f$ of the feedback resistor satisfies the following equation:

$$V_{IH} - V_{th} < R_f I_{d,max}$$

where $V_{IH}$ is a voltage corresponding to a logic high of the input signal, $V_{th}$ is a turn on voltage of the transistor, and $I_{d,max}$ is a maximum channel current through the transistor.

2. The logic inverter as recited in claim 1, wherein the logic inverter is configured to generate a digital output.

3. The logic inverter as recited in claim 1, further comprising a pull up resistor between a power supply and the output signal line.

4. The logic inverter as recited in claim 3, wherein a resistance value of the feedback resistor is lower than a resistance value of the pull up resistor.

5. A logic inverter with over-current protection, comprising:
a transistor;
an input signal line coupled to a gate terminal or base region of the transistor;
an output signal line coupled to a drain terminal or emitter region of the transistor;
a power supply line coupled to the drain terminal or emitter region of the transistor; and
a feedback resistor between a source terminal or collector region of the transistor and ground,
wherein a power rating of the feedback resistor is higher than a value $P_{max}$ calculated according to the following formula:

$$P_{max} = \frac{(V_{IH} - V_{th})^2}{R_f}$$

where $V_{IH}$ is a voltage corresponding to a logic high of the input signal, $V_{th}$ is a turn on voltage of the transistor, and $R_f$ is an impedance value $R_f$ of the feedback resistor.

6. The logic inverter as recited in claim 5, wherein the logic inverter is configured to generate a digital output.

7. The logic inverter as recited in claim 5, further comprising a pull up resistor between a power supply and the output signal line.

8. The logic inverter as recited in claim 7, wherein a resistance value of the feedback resistor is lower than a resistance value of the pull up resistor.

9. A logic circuit with overcurrent feedback protection mechanism, the logic circuit comprising:
a first transistor;
a first input signal line coupled to a gate terminal or a base region of the first transistor;
a power supply line coupled to a drain terminal or a collector region of the first transistor;
a second transistor, wherein a source terminal or a emitter region of the first transistor is coupled to a drain terminal or a collector region of the second transistor;
a second input signal line coupled to a gate terminal or a base region of the second transistor;
an output signal line coupled to a source terminal or an emitter region of the second transistor;
a third transistor, wherein a source terminal or an emitter region of the second transistor is coupled to a drain terminal or an emitter region of the third transistor, wherein the second input signal line is coupled to a gate terminal or a base region of the third transistor;
a feedback resistor between a source terminal or a collector region of the third transistor and ground; and
a fourth transistor, wherein the source terminal or the emitter region of the second transistor is coupled to a drain terminal or an emitter region of the fourth transistor, wherein the first input signal line is coupled to the gate terminal or the base region of the third transistor, wherein a source terminal or a collector region of the fourth transistor is coupled to the feedback resistor.

10. An isolated inverter with over-current protection, comprising:
a main photo-component;
an output signal line coupled to a collector region of the main photo-component;
a power supply line coupled to the collector region of the main photo-component;
a feedback resistor between an emitter region of the main photo-component and ground;
a main light source positioned to emit light for activating the main photo-component;
an input signal line coupled to the main light source;
a feedback light source coupled in shunt with the feedback resistor; and
a feedback photo-component coupled in shunt with the main light source and positioned to be activated by light from the feedback light source.

11. The isolated inverter as recited in claim 10, wherein at least one of the photo-components is a photo-transistor.

12. The isolated inverter as recited in claim 10, wherein at least one of the photo-components is a photo-resistor.

13. The isolated inverter as recited in claim 10, wherein at least one of the photo-components is a photo-diode.

14. The isolated inverter as recited in claim 10, the inverter is a fully isolated inverter.

15. The isolated inverter as recited in claim 14, comprising a current limiting resistor in series with a feedback phototransistor of the feedback photo-component.

16. The isolated inverter as recited in claim 14, comprising a pull-up resistor coupled between the power supply line and the collector region of the main photo-component.

* * * * *